United States Patent [19]

Norris et al.

[11] 3,766,637

[45] Oct. 23, 1973

[54] METHOD OF MAKING MOS TRANSISTORS

[75] Inventors: Peter Edward Norris, Princeton; Joseph Michael Shaw, Cranbury, both of N.J.

[73] Assignee: RCA Corporation, Princeton, N.J.

[22] Filed: May 4, 1972

[21] Appl. No.: 250,354

[52] U.S. Cl. .......... 29/571, 29/578
[51] Int. Cl. .......... B01j 17/00
[58] Field of Search .......... 29/571, 578; 317/235 B

[56] References Cited

UNITED STATES PATENTS

| | | | |
|---|---|---|---|
| 3,461,361 | 8/1969 | Delivorias | 317/235 |
| 3,514,845 | 6/1970 | Legat et al. | 29/571 |
| 3,698,071 | 10/1972 | Hall | 317/235 B |

*Primary Examiner*—Charles W. Lanham
*Assistant Examiner*—W. Tupman
*Attorney*—Glenn H. Bruestle et al.

[57] ABSTRACT

A method of making a complementary pair of N channel and P channel MOS transistors using aluminum oxide as the gate insulator material, in which the threshold voltage of the P channel unit is controlled to be in the −1 to −1.5 volt range by causing accumulation of N type dopants in the surface layer of the semiconductor body prior to deposition of the aluminum oxide. At the same time, the N channel unit is protected so that P type dopants are not unduly depleted from the surface layer of the semiconductor before deposition of aluminum oxide.

6 Claims, 11 Drawing Figures

METHOD OF MAKING MOS TRANSISTORS

The invention was made in the course of a contract with the Department of the Air Force.

BACKGROUND

Aluminum oxide has been found useful as a passivation layer on silicon monolithic integrated circuits and as an improved gate insulator in MOS devices. The use of $Al_2O_3$ on complementary symmetry MOS circuits (CMOS) has resulted in low-power, medium-to-high speed switching, high noise immunity circuits which are radiation resistant as well. These circuits continue to operate after exposure to radiation which could cause failure in similar circuits with silicon dioxide passivation and gate insulator layers.

Aluminum oxide passivation layers and gate insulators have previously been deposited by several methods including vapor deposition from the pyrohydrolytic reaction of $AlCl_3$ vapor with water vapor. However, one disadvantage of this pyrohydrolytic deposition method is that the presence of negative oxide charges results in MOS flat-band voltages in the range of +4 to +6 volts. These values are too high for the fabrication of CMOS integrated circuits since P/MOS depletion devices will result. For successful fabrication of these circuits, the oxide charge needs to be reduced. By employing certain process steps during growth of the aluminum oxide, and also introducing post-deposition heat treating steps, the negative charges have been reduced to a level where enhancement type P channel units can routinely be obtained. The threshold voltages for P channel units are typically −0.5v ± 0.2v. However, for many applications, a threshold voltage in the −1 to −2 volt range would be desirable.

SUMMARY OF INVENTION

The present invention is a method of processing a silicon semiconductor surface such that surface doping of the silicon body is controlled. Where both P channel and N channel MOS transistors are being made on adjacent portions of the same silicon semiconductor body, the N channel unit surface is first covered with a protective coating of, e.g. undoped $SiO_2$. Deposition of the $SiO_2$ may be accomplished by reaction between silane and oxygen at about 450° C. Preferably, the deposited layer is densified.

The surface of the P channel unit is then covered with a layer of $SiO_2$ grown in steam. In this type of process, the silicon in the $SiO_2$ comes from the semiconductor body. This type of process causes the concentration of N type dopants in the silicon body at the surface of the P channel unit to increase in the surface layer of the silicon substrate because they are rejected by the growing oxide.

Both oxide layers are then removed and aluminum oxide is deposited on the gate regions of both transistors.

THE DRAWING

FIGS. 1–10 are cross-section views illustrating successive steps in making a CMOS pair of transistors in accordance with the method of the present invention; and FIG. 11 is a schematic view of apparatus for depositing an $Al_2O_3$ coating.

DESCRIPTION OF PREFERRED EMBODIMENT

Figure 1:
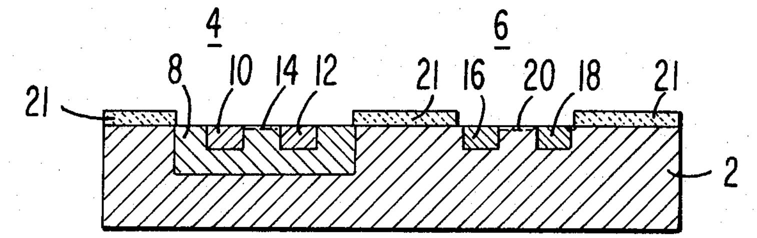

In making a complementary pair of MOS transistors, one may start with a rectangular shaped chip 2 (FIG. 1) of N type single crystal 0.25 ohm cm. silicon with a partially completed N channel MOS transistor 4 and a partially completed P channel MOS transistor 6. The N channel transistor 4 comprises a P type well 8 diffused into the N type body 2 and N+ source and drain regions 10 and 12, respectively diffused into P well 8. Between source and drain regions 10 and 12 is an N type channel 14. The P channel transistor 6 includes P+ type source and drain regions 16 and 18, respectively, and a P type channel 20 therebetween. The chip 2 has a surface protective coating 21 of $SiO_2$, about 10,000 A thick, over the top surface except for the P well 8 and the P channel transistor 6.

Figure 2:
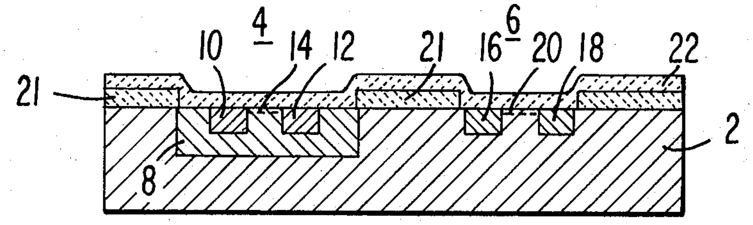

Next, (FIG. 2) another coating of undoped $SiO_2$ 22 about 6,000–7,000 A thick is deposited over the entire top surface of the chip 2 and on the coating 21 by the reaction of $SiH_4$ and oxygen at about 450° C. At this low temperature, redistribution of impurities within the silicon chip 2 does not take place.

Figure 3:
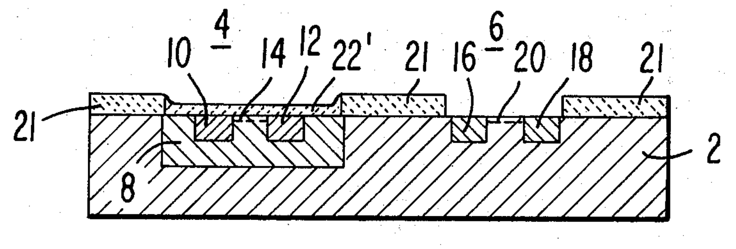

As shown in FIG. 3, the coating of $SiO_2$ 22 is then removed at least over the P channel transistor 6 and preferably from all areas except for a portion 22' over the P well 8. This is done by conventional photomasking, exposing and etching processes. The $SiO_2$ coating 22' is then preferably densified by heating in dry oxygen at 1000° C. The coating 22' serves as a protective shield for the surface of the channel region 14 during the next processing step.

Figure 4:
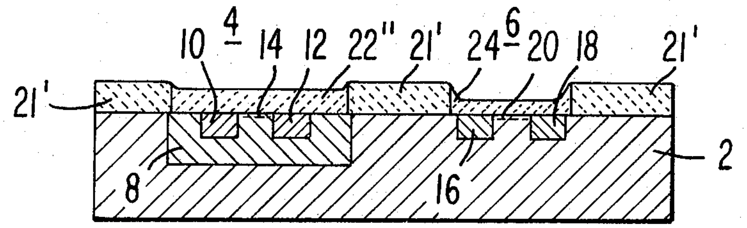

Next, as shown in FIG. 4, a layer of $SiO_2$ is grown on the entire upper surface of chip 2 including the densified $SiO_2$ coating 22'. This is done by exposing the surface to steam at 900° C. for 60 to 100 minutes. On that part of the chip surface not covered with the densified $SiO_2$ layer 22' or the thick $SiO_2$ layer 21, the layer 24 grows most rapidly by converting successive layers of silicon atoms to $SiO_2$. As the successive layers of $SiO_2$ build up, they reject the N type doping atoms that were in the silicon and cause these atoms to accumulate in the silicon surface adjacent the $SiO_2$ which is forming. Later, when aluminum oxide is deposited over the channel region 20, the increased N type doping of the channel region offsets the negative charge in the oxide and increases the value of the PMOS threshold voltage.

At the surface of the P well region 8, protected by the densified $SiO_2$ layer 22', growth of additional oxide takes place very slowly forming a thicker $SiO_2$ layer 22''. This has little effect on the concentration of P type dopant at the silicon - silicon dioxide interface. The reason that the protective layer 22' is needed is that when $SiO_2$ is grown on a P type silicon substrate, the P type dopant atoms tend to migrate into the oxide and decrease the doping concentration at the surface of the silicon. This has the effect of lowering the threshold voltage of an MOS transistor made of this material, more than desired, so that the transistor tends to become a depletion type instead of the desired enhancement type.

The original $SiO_2$ layer 21 also increases in thickness to form the thicker layer 21'.

Figure 5:
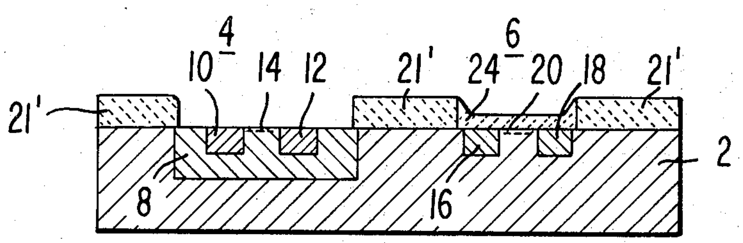
Figure 6:
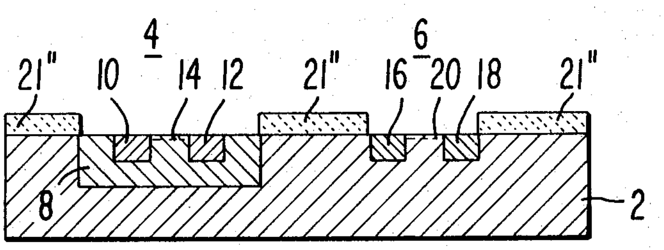

Next, the $SiO_2$ coatings 22'' and 24 are removed in two stages. In the first of these, by photomasking, exposing and etching with buffered HF, the thickened and densified oxide layer 22'' is removed from the surface of P well 8 (FIG. 5). This leaves oxide layer 24 overlying transistor 6. This layer 24 is then removed by another treatment with buffered HF (FIG. 6). At the same time, some of the $SiO_2$ layer 21' is removed to form a slightly thinner layer 21''. The denser, thicker layer of $SiO_2$ is removed first because a relatively long treatment with HF is needed to accomplish the removal. If the thinner layer of oxide over the transistor 6 were exposed to the HF at the same time, the oxide would be removed rapidly and the etchant would then attack the silicon oxide coating 21 around the edges of the transistor 6. This relatively thick coating functions to prevent shorting through to the substrate when metal electrode leads are deposited as described later. If it is partially removed, its effectiveness is impaired.

The next steps in the process (FIG. 7) are to deposit a layer 25 of $Al_2O_3$ on the top surface of the silicon chip 2 and a layer 27 of $SiO_2$ over the $Al_2O_3$.

Figure 11:
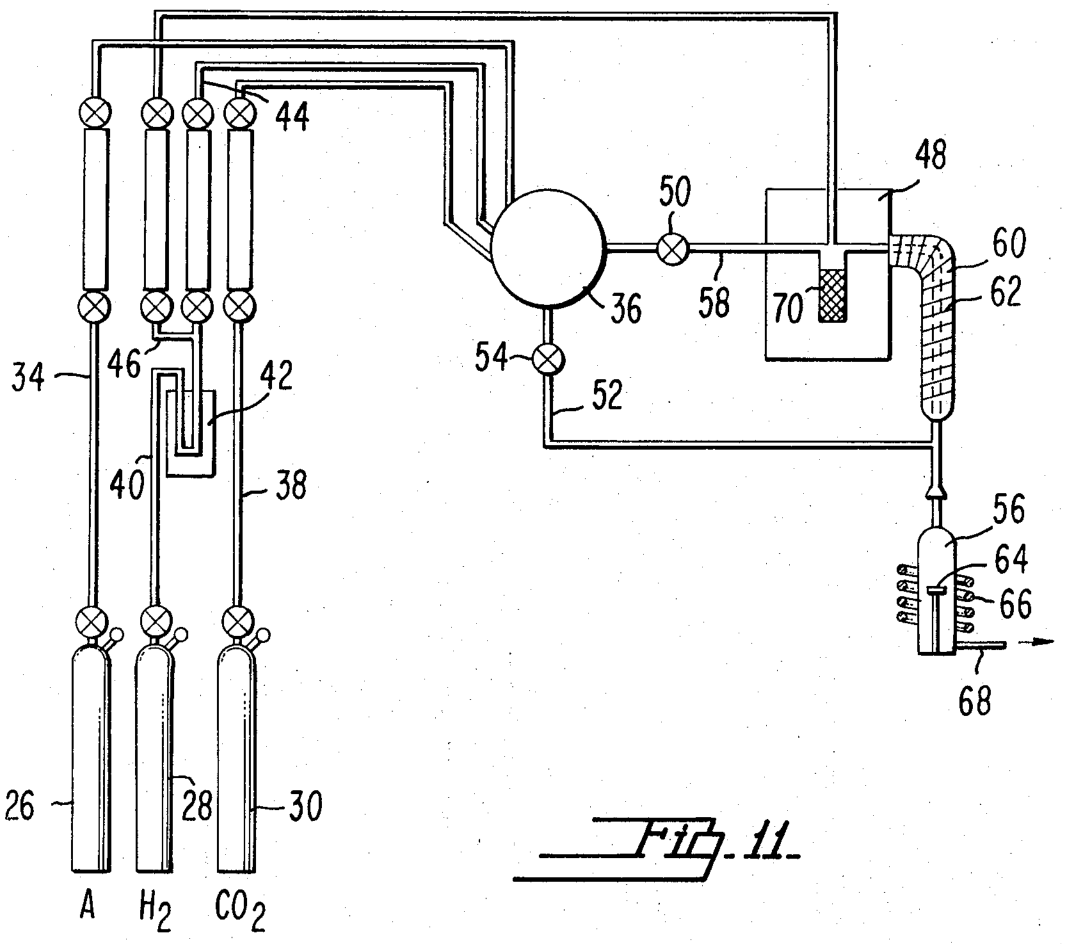

FIG. 11 is a schematic drawing of apparatus for carrying out the deposition of the $Al_2O_3$ layer 25. The apparatus comprises 3 gas tanks 26, 28 and 30 containing argon, hydrogen and carbon dioxide, respectively. The argon tank 26 has a line 34 leading to a mixing chamber 36. The carbon dioxide tank 30 also has a line 38 leading directly to the chamber 36. The hydrogen tank 28 has a line 40 leading through a cold trap 42 and then into a branch line 44 leading to the mixing chamber 36 and another branch line 46 leading into a means 48 for sublimating aluminum chloride. A line 52 leads from mixing chamber 36 through a valve 54 to a quartz reaction tube 56. A line 58, containing a valve 50, connects the mixing chamber 36 and sublimator 48.

At the exit side of sublimator 48 is a pipeline 60 surrounded by a heater 62. The line 60 also leads to reaction tube 56.

Inside the reaction tube 56 is a pedestal or susceptor 64. Outside reaction tube 56 is a conventional RF heater coil 66 connected to an RF generator (not shown). Leading from the reaction tube 56 is a vent 68.

In carrying out the improved method of depositing aluminum oxide, a wafer 2 which is at the manufacturing stage shown in FIG. 1, is placed on the pedestal of the susceptor 64 and inserted within the reaction tube 56.

The system is then flushed with argon from tank 26 for several minutes. The argon passes through line 34 to mixing chamber 36 from which it proceeds through line 58 to the sublimator 48 and thence through line 60 to the reaction tube 56. It also proceeds from the mixing chamber 36 through line 52.

The wafer 2 is preferably heated to 850° C from the RF heater coil 66. The heating temperature may be varied within a range of about 800° and 1000° C., however. With argon gas still flowing, hydrogen is permitted to flow from tank 28. The hydrogen flow is adjusted to about 2700 cc/min. and the temperature is permitted to stabilize for five to 10 minutes. When the hydrogen flow is established, the argon flow is shut off.

Meanwhile $AlCl_3$ in solid form was placed within a flask 70 within the sublimator 48 prior to deposition and flask 70 was heated at a temperature high enough to obtain a sufficient partial pressure of the aluminum compound. Aluminum chloride has a vapor pressure of approximately 10 mm at a temperature of about 125° C. Hydrogen flowing through line 46 to the sublimator 48 picks up the $AlCl_3$ vapor and carries it through the heated tube 60 into reaction tube 56. The tube 60 is heated so that $AlCl_3$ does not condense on its walls before reaching the reaction tube. The hydrogen, laden with $AlCl_3$ vapor, is adjusted to a flow rate of about 350 cc/min. Hydrogen also flows through line 44 to the mixing chamber 36 where it is mixed with carbon dioxide.

The carbon dioxide flows through line 38 to mixing chamber 36 and is adjusted to a flow rate of about 20 cc/min.

The chemical reaction which occurs is as follows:

$$2\ AlCl_3 + 3H_2 + 3CO_2 \xrightarrow{850^\circ C} Al_2O_3 + 6HCl + 3CO$$

The hydrogen and carbon dioxide react to form water and carbon monoxide, and the water (vapor) reacts with the $AlCl_3$ to form $Al_2O_3$ and HCl.

It has been found that there is an incubation period of about 30 seconds before an $Al_2O_3$ film begins to deposit on the wafer 2. After about 5–6 minutes an interference color produced by the growing film becomes visible. A "straw" color indicates a thickness of 400 A. The film may have any thickness up to about 4000 A. A growth rate of 75 – 100 A/min. is preferably maintained but this can be more widely varied between about 50 and 125 A/min.

When the desired thickness of $Al_2O_3$ has been obtained, the deposition is terminated by simultaneously shutting off the $AlCl_3$ — hydrogen carrier flow and the $CO_2$ flow.

Next, the $Al_2O_3$ — coated wafer is annealed for about 20 minutes (at least 10 minutes) in hydrogen at the growth temperature of 850° C. The annealing time should not be less than about 10 minutes and can be much longer than 20 minutes, but there is little benefit from using longer times.

Following the annealing step, the wafer is permitted to cool slowly at a temperature decrease of 20° – 25° C/min. (or slower) until, after about 20 minutes or so, a temperature of 300° – 400° C is reached. The slow cooling takes place in the hydrogen atmosphere. There does not appear to be any additional benefit from cooling at a rate slower than 20° C/min. although a slower rate is not detrimental.

When the temperature has dropped to 300° – 400° C the RF power is turned off and the wafer is allowed to cool more rapidly to room temperature. Argon gas is then substituted for hydrogen and the wafer is removed from the reaction tube 56 for further processing. The gas line 52 may be used to assist flushing operations.

Figure 7:
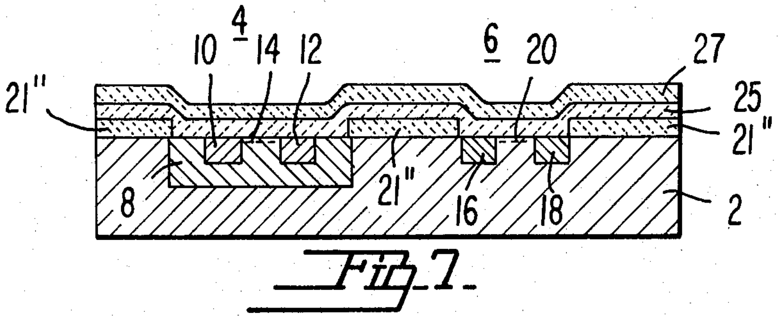
Figure 8:
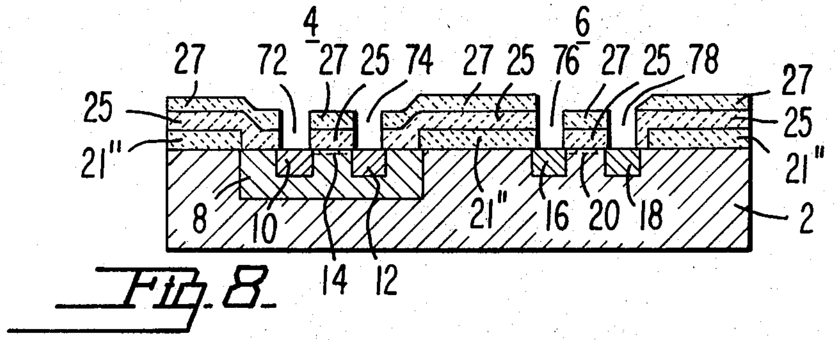

Further processing includes deposition of the layer 27 of $SiO_2$ on top of the layer 25 of $Al_2O_3$ (FIG. 7). This $SiO_2$ layer may be deposited by oxidation of silane ($SiH_4$). Using conventional photomasking and etching techniques, part of $SiO_2$ layer 27 is removed over portions of the source and drain regions 10 and 12 of transistor 4 and over source and drain regions 16 and 18 of transistor 6 (FIG. 8) where ohmic contacts are to be made to these regions. Then, using the remaining $SiO_2$ as a mask, the $Al_2O_3$ layer 25 is removed in these areas to form openings 72 an 74 over source and drain regions 10 and 12, respectively, of the N channel transistor 4. Openings 76 and 78 are similarly formed over source and drain regions 16 and 18, respectively, of the P channel transistor 6. The $Al_2O_3$ layer is etched with hot phosphoric acid at 180° C.

Figure 9:
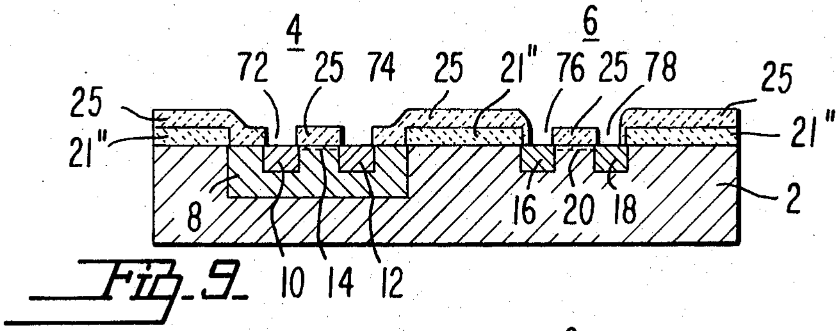
Figure 10:
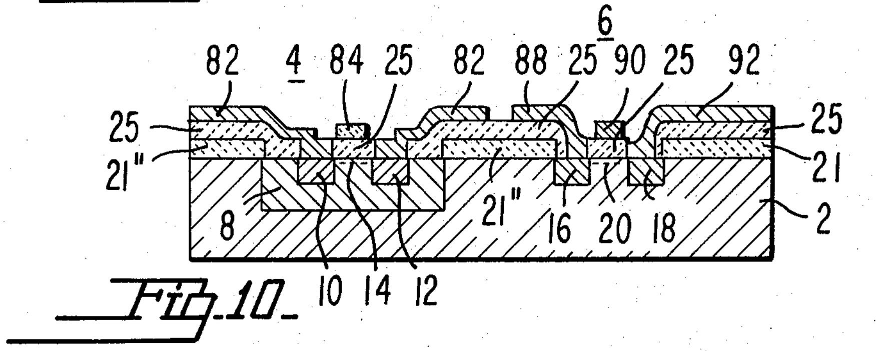

The masking layer of $SiO_2$ is then removed (FIG. 9), and a layer of aluminum is deposited over the entire surface of the device. This layer of aluminum is then defined (FIG. 10) to form a connection 82 to source region 10 of transistor 4, a gate electrode 84 over channel region 14, a drain connection 86 to drain region 12, a source connection 88 to source region 16 of transistor 6, a gate electrode 90 over channel region 20 and a drain connection 92 over drain region 18. These aluminum connections and electrodes are later sintered to improve their properties.

Although the protective coating which is deposited on the surface of the P well region 8 which has been described as densified silicon dioxide, it can also be silicon nitride in which case hot (180° C) phosphoric acid is used to remove it.

Using the method described above, P channel MOS units have been made with threshold voltages in the −1.0 to −1.5 volt range. These thresholds are large enough so that P channel devices remain enhancement mode even after exposure to large doses of ionizing radiation.

We claim:

1. A method of making a complementary pair of N channel and P channel MOS transistors on the same single crystalline silicon substrate comprising:

depositing a first protective coating on the N channel transistor surface, growing a coating of silicon dioxide on said P channel transistor by exposing it to steam such that the surface of the P channel transistor increases in concentration of N type impurities but the protected surface of the N channel transistor is not appreciably affected, removing all of said coatings from both the N channel and P channel transistors, depositing a gate electrode insulator comprising aluminum oxide on the channel region of both the N channel transistor and the P channel transistor, and depositing metallic electrodes on said aluminum oxide, which electrodes contact the surface of said substrate.

2. A method according to claim 1 in which said steam is at a temperature of about 900° C and the time of treatment is about 60 to 100 minutes.

3. A method according to claim 1 in which said aluminum oxide is deposited pyrohydrolytically.

4. A method according to claim 1 in which said protective coating is silicon nitride.

5. A method according to claim 3 in which said aluminum oxide is deposited at a growth rate of about 50 – 125 A/min., the deposited aluminum oxide layer is annealed at growth temperature in hydrogen for at least 10 minutes, and the annealed layer is then slow-cooled in hydrogen until the temperature of the silicon body decreases to about 300° – 400° C.

6. A method according to claim 5 in which said slow cooling is at a rate of 20° – 25° C./min.

* * * * *